(12) United States Patent
Kim et al.

(10) Patent No.: US 10,725,333 B2
(45) Date of Patent: Jul. 28, 2020

(54) DISPLAY DEVICE

(71) Applicant: SAMSUNG DISPLAY CO., LTD., Yongin-si, Gyeonggi-do (KR)

(72) Inventors: Kanguk Kim, Hwaseong-si (KR); Sungman Kim, Seoul (KR); Jungsuk Bang, Seoul (KR); Donchan Cho, Seongnam-si (KR); Youngje Cho, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 196 days.

(21) Appl. No.: 15/892,261

(22) Filed: Feb. 8, 2018

(65) Prior Publication Data

US 2019/0212610 A1 Jul. 11, 2019

(30) Foreign Application Priority Data

Feb. 8, 2017 (KR) .................. 10-2017-0017295

(51) Int. Cl.
*G09G 3/30* (2006.01)
*G02F 1/1335* (2006.01)
*G02F 1/1362* (2006.01)
*G09G 3/3208* (2016.01)
*H01L 27/32* (2006.01)
*G02F 1/1343* (2006.01)
*G02F 1/13357* (2006.01)
(Continued)

(52) U.S. Cl.
CPC ...... *G02F 1/133514* (2013.01); *G02F 1/1343* (2013.01); *G02F 1/133504* (2013.01); *G02F 1/133512* (2013.01); *G02F 1/133617* (2013.01); *G02F 1/136286* (2013.01); *G09G 3/20* (2013.01); *G09G 3/3208* (2013.01); *H01L 27/322* (2013.01); *H01L 27/3211* (2013.01); *G02F 2202/36* (2013.01); *G09G 2300/0452* (2013.01); *H01L 27/3218* (2013.01); *H01L 51/5284* (2013.01); *H01L 2251/5369* (2013.01)

(58) Field of Classification Search
None
See application file for complete search history.

(56) References Cited

U.S. PATENT DOCUMENTS

| 7,920,231 B2 | 4/2011 | Tanno et al. |
| 8,582,057 B2 | 11/2013 | Jung et al. |
| 9,599,856 B2 | 3/2017 | Lee et al. |

(Continued)

FOREIGN PATENT DOCUMENTS

| JP | 2002-98824 A | 4/2002 |
| JP | 2009036795 A | 2/2009 |

(Continued)

*Primary Examiner* — Joseph R Haley
(74) *Attorney, Agent, or Firm* — Innovation Counsel LLP

(57) ABSTRACT

A display device may include a first substrate, a first color conversion unit, a second color conversion unit, a light diffusion unit, and a first wall. The first color conversion unit is located on the first substrate. The second color conversion unit is disposed on the first substrate and is spaced from the first color conversion unit. The light diffusion unit is disposed between the first color conversion unit and the second color conversion unit. The first wall is disposed between the first color conversion unit and the light diffusion unit. The first color conversion unit includes a first-color conversion layer. The first-color conversion layer overlaps two pixel regions.

20 Claims, 12 Drawing Sheets

(51) Int. Cl.
*G09G 3/20* (2006.01)
*H01L 51/52* (2006.01)

(56) References Cited

U.S. PATENT DOCUMENTS

2002/0158576 A1* 10/2002 Yamada .............. H01L 27/3244
    313/505
2016/0033823 A1* 2/2016 Lee ................... G02F 1/133617
    349/71

FOREIGN PATENT DOCUMENTS

| | | |
|---|---|---|
| JP | 2013-213932 A | 10/2013 |
| KR | 1020050008284 A | 1/2005 |
| KR | 10-2010-0037283 A | 4/2010 |
| KR | 10-2013-0034168 A | 4/2013 |
| KR | 10-1592481 B1 | 2/2016 |
| KR | 1020160015480 A | 2/2016 |

* cited by examiner

DISPLAY DEVICE

CROSS-REFERENCE TO RELATED APPLICATION

This application claims priority to and the benefit of Korean Patent Application No. 10-2017-0017295 filed in the Korean Intellectual Property Office on Feb. 8, 2017; the entire contents of the Korean Patent Application are incorporated herein by reference.

BACKGROUND

(a) Technical Field

The technical field relates to a display device.

(b) Description of the Related Art

A display device, such as a liquid crystal display device (LCD), an organic light emitting display device (OLED), an electrophoretic display device (EPD), or a quantum dot light emitting display device (QLED), may include a color filter matrix for outputting colorful images. The color filter matrix may include filters of different colors.

SUMMARY

An embodiment may be related to a display device comprising a first substrate, a first color conversion unit located on the first substrate, a second color conversion unit disposed on the first substrate and spaced apart from the first color conversion unit, a light diffusion unit disposed between the first color conversion unit and the second color conversion unit, a first side-wall disposed between the first color conversion unit, the second color conversion unit, and the light diffusion unit, wherein the first color conversion unit and the second color conversion unit respectively include a first color conversion layer and a second color conversion layer, and wherein at least one of the first color conversion unit and the second color conversion unit has an area corresponding to two pixel regions.

An embodiment may be related to a display device comprising a first color conversion unit located on a substrate, a second color conversion unit disposed on the substrate and spaced apart from the first color conversion unit, a third color conversion unit disposed between the first color conversion unit and the second color conversion unit, a first side-wall disposed between the first color conversion unit and the third color conversion unit, wherein the first color conversion unit, the second color conversion unit, and the third color conversion unit each include color conversion particles, and wherein at least one of the first color conversion unit, the second color conversion unit, and the third color conversion unit has an area corresponding to two pixel regions.

An embodiment may be related to a display device. The display device may include a first substrate, a first color conversion unit, a second color conversion unit, a light diffusion unit, and a first wall. The first color conversion unit may be located on the first substrate. The second color conversion unit may be disposed on the first substrate and may be spaced from the first color conversion unit. The light diffusion unit may be disposed between the first color conversion unit and the second color conversion unit. The first wall may be disposed between the first color conversion unit and the light diffusion unit. The first color conversion unit may include a first-color conversion layer. The first-color conversion layer may overlap two pixel regions.

The display device may include a second wall spaced from the first wall, extending parallel to the first wall, and positioned between two portions of the first-color conversion layer.

The display device may include a black matrix disposed between at least one of the first wall and the second wall and the first substrate and defining boundaries of pixel region of the display device.

A width of the first color conversion unit may be in a range of 1.5 to 2.5 times a width of the light diffusion unit.

The first-color conversion layer may include quantum dot particles.

The first wall may be taller than the second wall.

The first wall may have a height (or thickness) of 5 micrometers or more in a direction perpendicular to the first substrate.

The second wall has a height (or thickness) of 1 micrometer or less in a direction perpendicular to the first substrate.

A portion of the first-color conversion layer may be positioned between two sections of the second wall and may directly contact each of the two sections of the second wall.

The display device may include a blue light source. The light diffusion unit may be colorless and may correspond to the pixel region of the display device.

The first color conversion unit may include a first-color filter layer overlapping the first-color conversion layer. The second color conversion unit may include a second-color conversion layer and a second-color filter layer overlapping each other. The light diffusion unit may include a light transmission layer and a light diffusion layer overlapping each other.

The display device may include the following elements: a second substrate; a gate line disposed on the second substrate and intersecting the first wall; a data line disposed on the second substrate and intersecting the data line; a switching element connected to the gate line and the data line; a pixel electrode connected to the switching element; a common electrode disposed on the first substrate; and a liquid crystal layer disposed between the first substrate and the second substrate.

The display device may include the following elements: a first organic light emitting diode; a second organic light emitting diode; and an encapsulation layer encapsulating each of the first organic light emitting diode and the second organic light emitting diode, positioned between the first organic light emitting diode and the first color conversion unit, and positioned between the second organic light emitting diode and the second color conversion unit.

The display device may include: a pixel defining layer. The pixel defining layer may be disposed between the first organic light emitting diode and the second organic light emitting diode. A face of the pixel defining layer may be coplanar with each of a face of the first organic light emitting diode and a face of the second organic light emitting diode.

The first color conversion layer is disposed on the encapsulation layer.

The first color conversion unit may include a first-color filter layer overlapping the first-color conversion layer. The light diffusion unit may include a light transmission layer and a light diffusion layer overlapping each other. The first wall may directly contact each of the first-color conversion layer, the first-color filter layer, the light transmission layer, and the light diffusion layer.

The display device may include a second wall extending parallel to the first wall, directly contacting each of the first-color conversion layer and the first-color filter layer, positioned between two portions of the first-color conversion layer, and positioned between two portions of the first-color filter layer.

The first-color conversion layer may directly contact two opposite sides of the second wall.

The display device may include a data line overlapping the first-color conversion layer.

A material of the first wall may be identical to a material of the light diffusion layer.

An embodiment may be related to a display device. The display device may include a first substrate, a plurality of pixel electrodes, a first-color conversion unit, a second-color conversion unit, a third-color conversion unit, and a first wall. The plurality of pixel electrodes may overlap the first substrate. The first-color conversion unit may be located on the first substrate. The second-color conversion unit may be disposed on the first substrate and may be spaced from the first-color conversion unit. The third-color conversion unit may be disposed between the first-color conversion unit and the second-color conversion unit. The first wall may be disposed between the first-color conversion unit and the third-color conversion unit. The first-color conversion unit may include a first-color conversion layer. The first-color conversion layer may overlap two pixel electrodes of the plurality of pixel electrodes.

DETAILED DESCRIPTION

Figure 1:
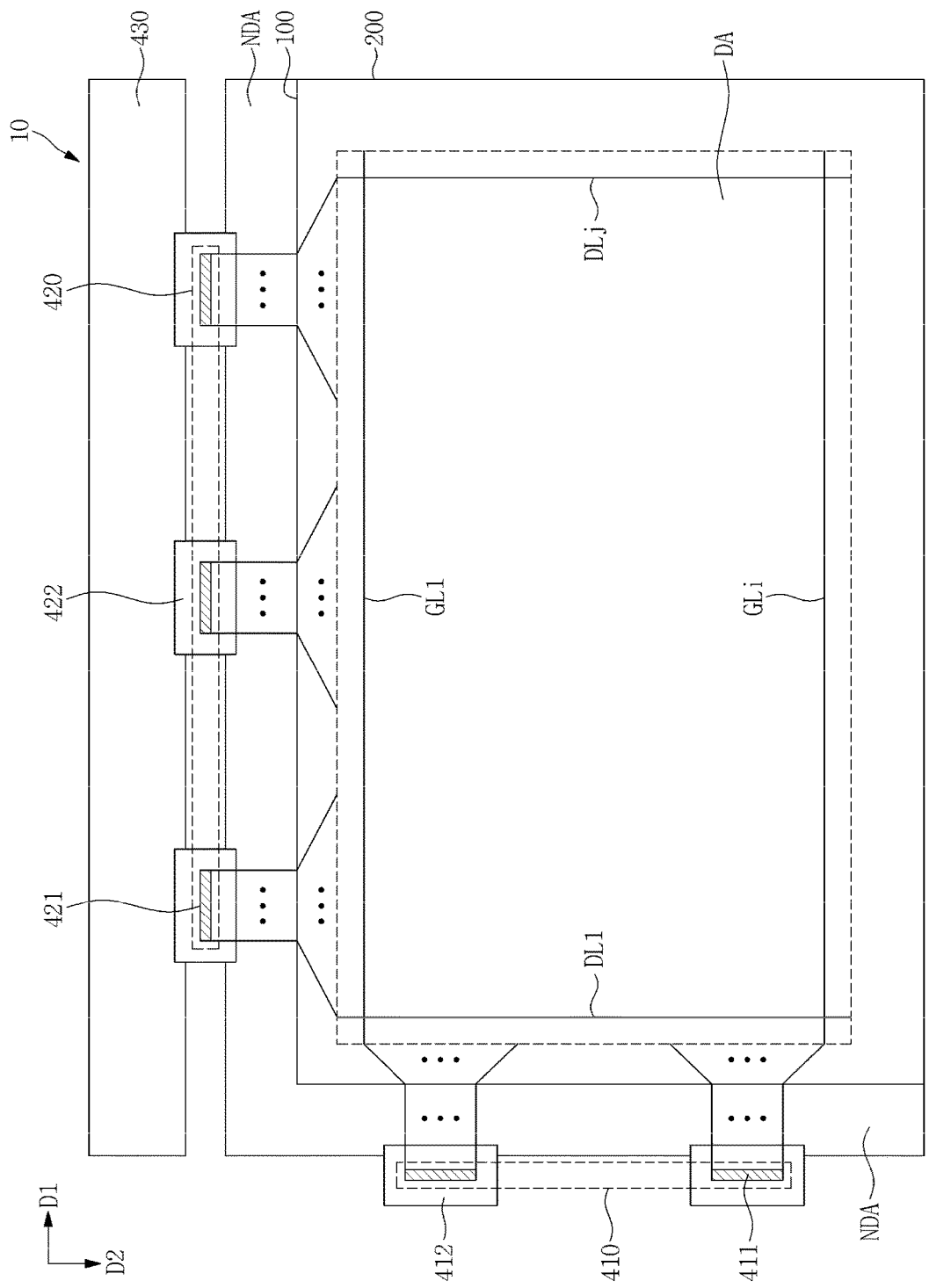
FIG. 1 is a plan view schematically showing a display device according to an embodiment.

Example embodiments are described with reference to the accompanying drawings. Practical embodiments are not limited to the described embodiments, but may be embodied in many different forms.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively. Like reference numerals may refer to like elements.

Spatially relative terms should be understood to include, in addition to the orientation shown in the drawings, terms that include different orientations of the device during use or operation. For example, when inverting a combination of elements shown in the figures, a first element described as "below" or "beneath" of a second element may be placed "above" the second element. Thus, the term "below" may include both the up and down directions. The combination of elements can also be oriented in different directions, so that spatially relative terms can be interpreted according to orientations.

Unless defined otherwise, all terms (including technical and scientific terms) used herein may be used in a sense that is commonly understood by one of ordinary skill in the art to which this invention belongs. Also, commonly used predefined terms are not ideally or excessively interpreted unless explicitly defined otherwise.

As an example, an LCD includes a first substrate and a second substrate overlapping the first substrate includes liquid crystal disposed between the substrates. A first substrate may include a plurality of pixel electrodes and a thin film transistor array. A second substrate may include a color filter array and a common electrode. An LCD is a device displaying video image by controlling transmission ratio of incident light provided from a back light unit. A color filter array may be fabricated either on a substrate having thin film transistor array or on the opposite substrate.

As an example, an OLED includes an array of organic light emitting diodes that produces video images by inducing electric current to electroluminescent layer for causing light emission from combinations of electron-hole pairs. An organic light emitting diode is formed by stacking a plurality of organic compound layers such as a hole injection layer (HIL), a hole transport layer (HTL), an emission layer (EML), an electron transport layer (ETL), and an electron Injection layer (EIL).

As an example, a quantum dot light emitting display (QLED) is a display device applying quantum dots for light emitting elements and producing a range of color spectrum using various sizes of quantum dots. A quantum dot is a nano-crystalline semiconductor having a size smaller than the radius of a Bohr Exciton. A quantum dot is of a few nanometers in size, and the number of free electrons is limited to 1 to 100. Electrons are bound to discontinuous energy levels so as to show distinguished electrical and optical properties unlike in bulk state.

Embodiments may be related to a color filter matrix without color-mix between neighboring pixels, particularly in high resolution color matrix. Embodiment may prevent color-mix defects between neighboring pixels filled with ink of different colors. In manufacturing a color filter matrix by ink-jet printer, color filter ink may be dropped and annealed in side-walled spaces formed with light blocking material on a color filter substrate. Without side-walls (or walls) between neighboring color pixels, color-mix defects due to ink-jetting inaccuracy may occur, and display quality may be affected.

Figure 2:
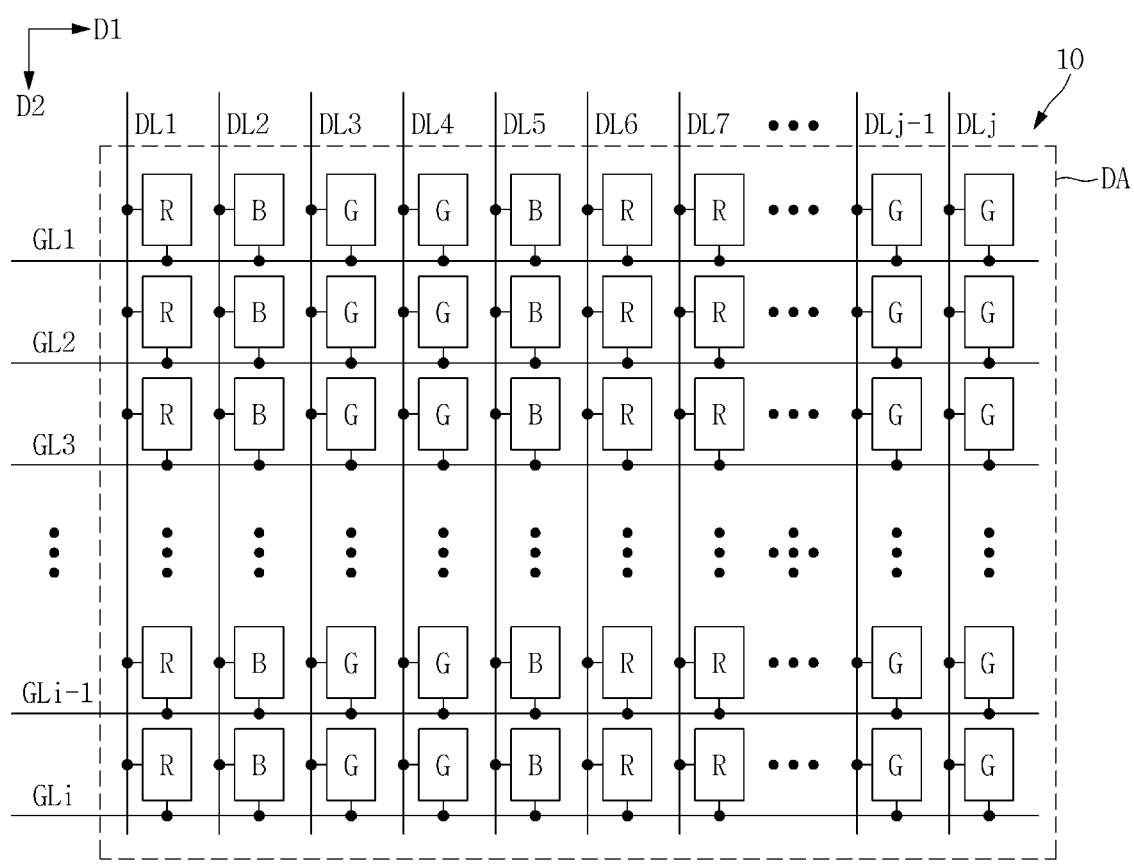
FIG. 2 is a plan view showing a pixel structure of a display panel according to an embodiment.

FIG. 1 is a plan view schematically showing a display device according to an embodiment. FIG. 2 is a plan view showing a pixel structure of a display panel according to an embodiment. The display device includes a display panel 10, a gate driver 410 and a data driver 420, as shown in FIG. 1. The display panel 10 includes a first panel 100 and a second panel 200, as shown in FIG. 1. The display panel 10 is divided into a display area DA and a non-display area NDA.

The display area DA of the display panel 10 corresponds to the display area DA of the first panel 100 and the display area DA of the second panel 200. The non-display area NDA of the display panel 10 corresponds to the non-display area NDA of the first panel 100 and the non-display area NDA of the second panel 200.

The second panel 200 may include a second substrate, a plurality of gate lines (GL1, GL2, GL3, ... GLi−1, and GLi), a plurality of data lines (DL1, DL2, DL3, DL4, DL5, DL6, DL7, ... DLj−1, and DLj), and a common line. The gate lines, the data lines, and the common line are located on the second substrate.

The data lines cross the gate lines. The gate lines extend to the non-display area NDA along the first direction D1 and are connected to the gate driver 410. The data lines extend in the first direction D1 and extend to the non-display area NDA along the second direction D2 intersecting the first direction D1 and connected to the data driver 420.

The gate driver 410 includes a plurality of gate drive integrated circuits 411. The gate drive integrated circuits 411 generate gate signals and sequentially supply the gate signals to the first to i-th gate lines.

Each gate driving integrated circuit 411 is mounted on a gate carrier 412. The gate carriers 412 are electrically connected to the second panel 200. For example, each of the gate carriers 412 may be electrically connected between the circuit board 430 and the non-display area NDA of the second substrate.

The data driver 420 includes a plurality of data driving integrated circuits 421. The data driving integrated circuits 421 receive digital image data signals and data control signals from the timing controller.

The data driving ICs 421 sample the digital image data signals according to the data control signals, latch the sampling image data signals corresponding to one horizontal line in each horizontal period, and output the latched image data signals to the data lines. That is, the data driving ICs 421 convert digital image data signals from the timing controller into analog image signals using a gamma voltage input from a power supply and supply them to the data lines.

Each data driving integrated circuit 421 is mounted on a data carrier 422. The data carriers 422 are connected between the circuit board 430 and the second panel 200. For example, each of the data carriers 422 may be electrically connected between the circuit board 430 and the non-display area NDA of the second substrate.

The timing controller and power supply section described above may be located on the circuit board 430. The data carrier 422 may include input wires for transmitting various signals from the timing controller and power supply to the data drive integrated circuit 421.

And output wirings for transmitting the video data signals output from the data driving integrated circuit 421 to corresponding data lines. In an embodiment, at least one data carrier 422 may further include auxiliary wiring for transmitting various signals from the timing controller and the power supply unit to the gate driver 410. These panel wirings connect the auxiliary wirings and the gate driver 410 to each other. The panel wirings may be formed on the non-display area NDA of the second substrate in a line-on-glass manner.

The common line is supplied with a common voltage from the above-described power supply unit. To this end, a common line may be connected to the power supply through a line located in the gate carrier 412 and a line located in the data carrier 422.

The display panel 10 includes a plurality of pixels (R, G, B) as shown in FIG. 2. The pixels (R, G, B) are located in the display area DA of the display panel 10. The pixels (R, G, B) are respectively connected to the gate lines GL1 to GLi and the data lines DL1 to DLj through switching elements.

The pixels (R, G, B) are arranged in a matrix form. The pixels (R, G, B) are arranged in the order of a first color pixel Red (R) for displaying the first color, a second color pixel Green (G) for displaying the second color, and a third color pixel Blue (B). The first color may be red, the second color may be green, and the third color may be blue. A first color pixel R, a second color pixel G, and a third color pixel B which are consecutive in the horizontal direction may form a unit pixel for displaying one unit image.

According to the embodiment, a plurality of pixels that display the same color can be disposed adjacent to each other along the second direction D2. Specifically, a plurality of first color pixels R are arranged adjacent to each other along the second direction D2; a plurality of second color pixels G, spaced from the plurality of first color pixels R, are disposed adjacent to each other along the two directions D2; a plurality of third color pixels B, are provided between the plurality of first color pixels R and the plurality of second color pixels G. Two pixels for displaying the same color, for example, two first color pixels R or two second color pixels G, are arranged immediately neighboring each other along the first direction D1.

Figure 3:
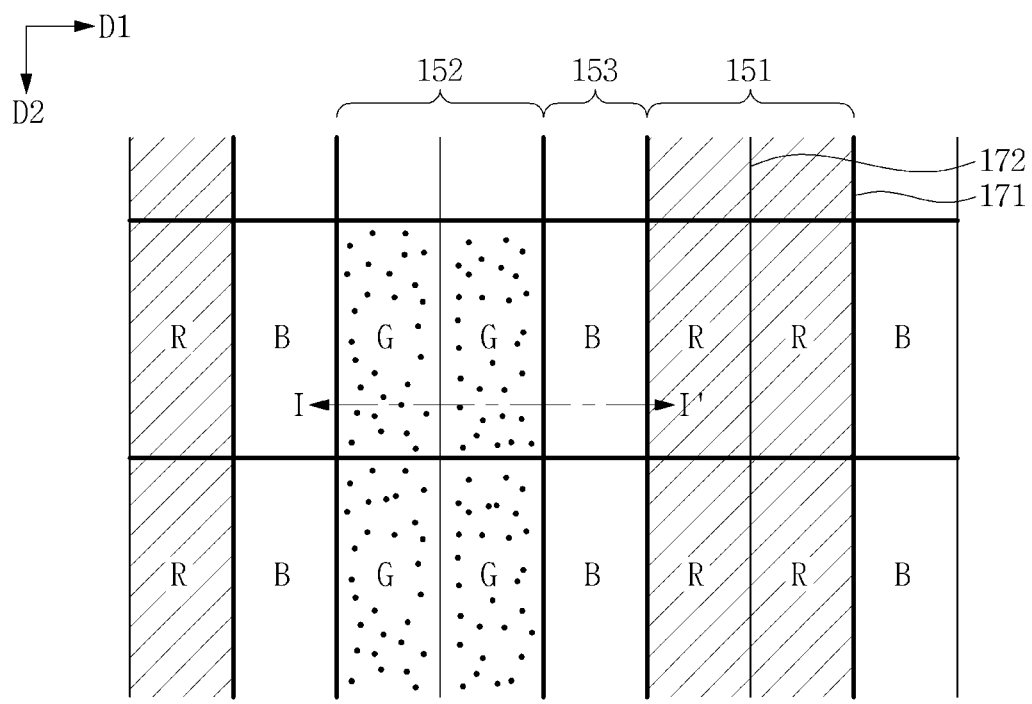
FIG. 3 is a plan view showing a part of a first panel of a display device according to an embodiment.

FIG. 3 is a plan view showing a part of the first panel 100 according to an embodiment. Referring to FIG. 3, the first color conversion unit 151 has an area corresponding to two first color pixels R. A second side-wall 172 is interposed between the two first color pixels R. The second color conversion unit 152 has an area corresponding to two second color pixels G. A second side-wall 172 is interposed between the two second color pixels G. The light diffusing unit 153 may have a width corresponding to one third color pixel.

In an embodiment, the areas of the first color pixel R, the second color pixel G and the third color pixel B may be different from each other. For example, the first color pixel R, the second color pixel G, and the third color pixel B may have different widths or different lengths. Each of the first color conversion unit 151 and the second color conversion unit 152 may have an area in a range of 1.5 to 2.5 times that of the light diffusion unit 153.

The first color conversion unit 151 may be a straight line extending along the second direction D2 as shown in FIG. 3. In an embodiment, the first color conversion unit 151 may have a rectangular shape. For example, two pixel regions disposed adjacent to each other along the second direction D2 are divided by a first side-wall 171 extending along the first direction D1 to form a first color conversion unit 151. That is, the first color conversion unit 151 may extend in at least one of the first direction D1 and the second direction D2.

Figure 10:
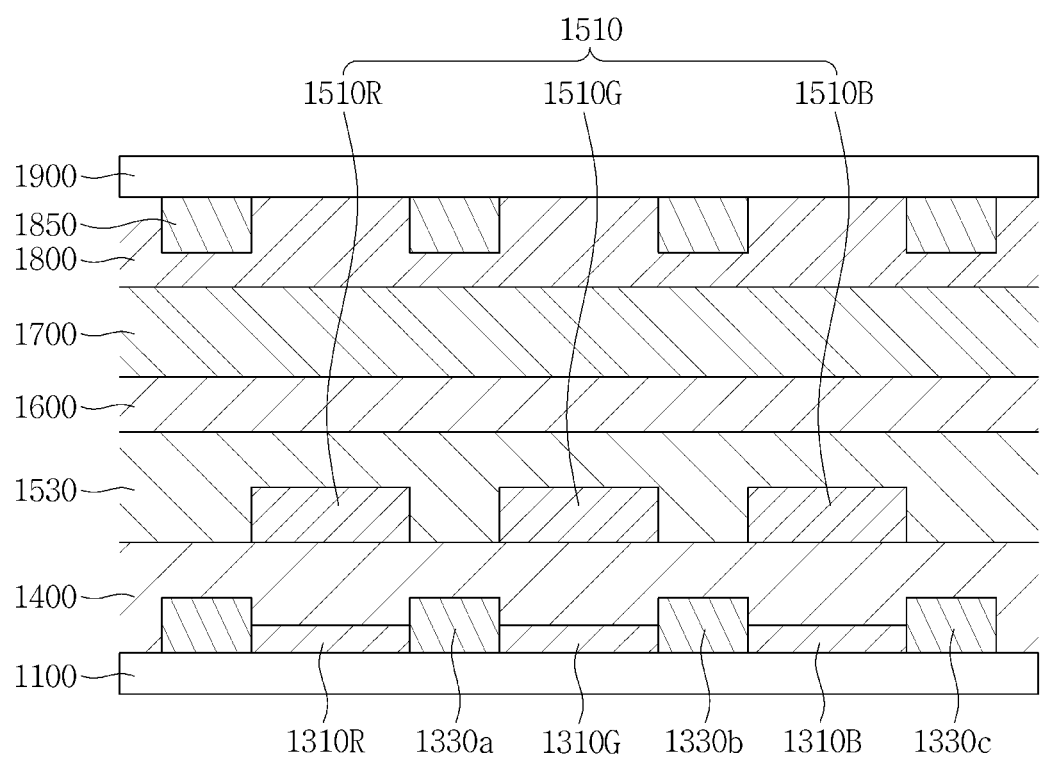
FIG. 10 is a cross-sectional view of an organic light emitting display panel according to an embodiment.

The first substrate 101 may include a first electrode, an organic light-emitting layer disposed on the first electrode, a second electrode disposed on the organic light-emitting layer, and an encapsulating layer disposed on the second electrode. Referring to FIG. 3 and FIG. 10, the first color conversion unit 151 (or a first color filter 1510R), the second color conversion unit 152 (or a second color filter 1510G), and the light diffusion unit 153 (or a third color filter 1510B) can be disposed on the encapsulation layer 1400.

Figure 4:
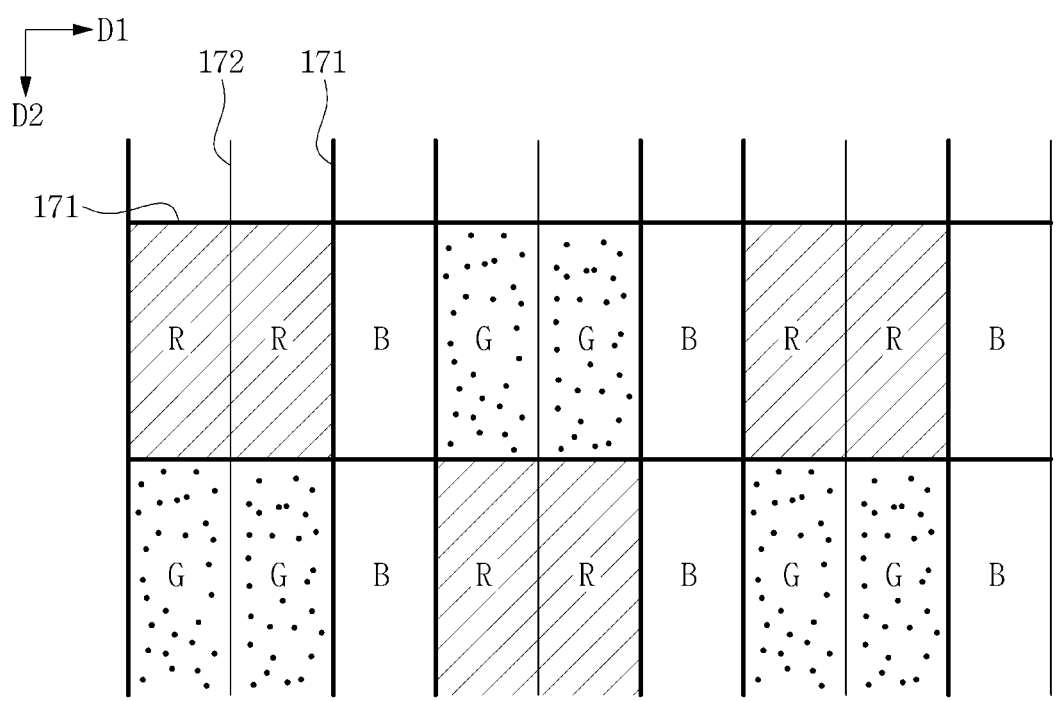
FIG. 4 is a plan view showing a part of a first panel of a display device according to an embodiment.

FIG. 4 is a plan view showing a part of a first panel 100 according to an embodiment. According to an embodiment, first color conversion units 151 and second color conversion units 152 may be alternately arranged along the second direction D2. For example, as shown in FIG. 4, a first color conversion unit 151 and a second color conversion unit 152 are arranged adjacent to each other in the second direction D2.

Figure 5:
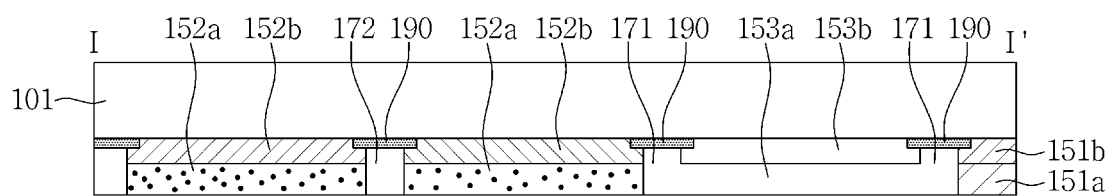
FIG. 5 is a cross-sectional view taken along line I-I' of FIG. 3 according to an embodiment.
Figure 6:
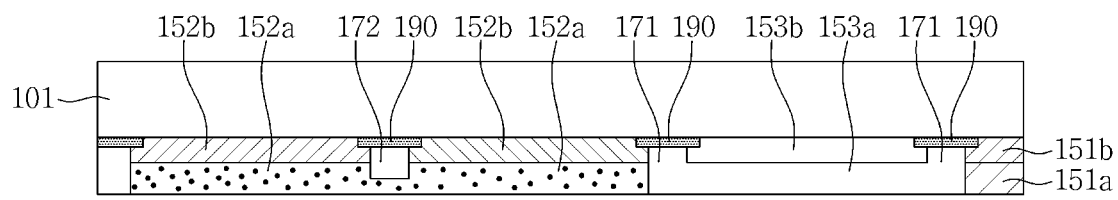
FIG. 6 is a cross-sectional view showing a part of a first panel according to an embodiment.
Figure 7:
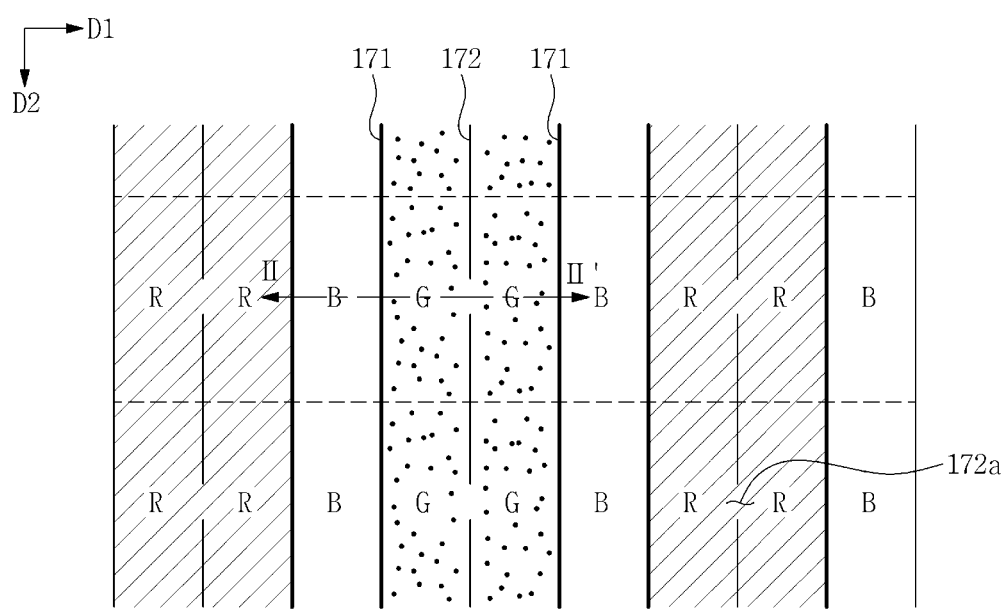
FIG. 7 is a plan view showing a part of a first panel according to an embodiment.
Figure 8:
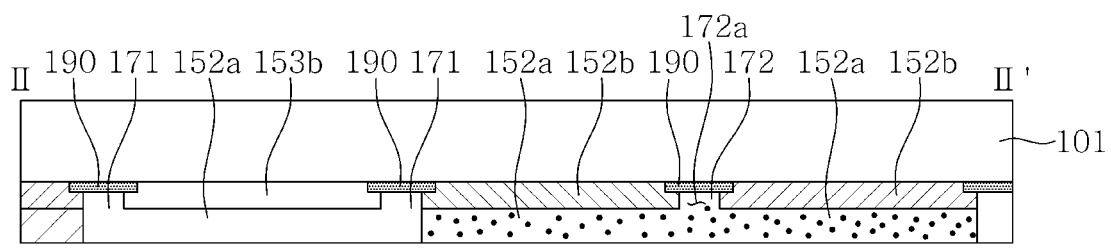
FIG. 8 is a cross-sectional view taken along line II-II' of FIG. 7 according to an embodiment.

FIG. 5 is a cross-sectional view taken along line I-I' of FIG. 3 according to an embodiment. FIG. 6 is a cross-sectional view showing a part of a first panel 100 according to an embodiment. FIG. 7 is a plan view showing a part of a first panel 100 according to an embodiment, FIG. 8 is a cross-sectional view taken along line II-II' of FIG. 7 according to an embodiment.

According to FIG. 3 and FIG. 5, the first panel 100 includes a first substrate 101, a first color conversion unit 151, a second color conversion unit 152, a light diffusion unit 153, a first side-wall 171 (or wall 171), a second side-wall 172 (or wall 172), and a black matrix 190.

The first color conversion section 151 includes a first color conversion layer 151a (or first-color conversion layer 151a) and a first color filter layer 151b (or first-color filter layer 151b). The second color conversion unit 152 includes a second color conversion layer 152a and a color filter layer 152b.

The first color conversion layer 151a and the second color conversion layer 152a may each include a resin containing color conversion particles. The color conversion particles emit fluorescence when irradiated with light or radiation, and emit light having a color inherent in the color conversion particles. In an embodiment, the color conversion particles emit light to the entire region irrespective of the direction of the irradiated light.

The color conversion particles included in the first color conversion layer 151a and the second color conversion layer 152a may be/include quantum dots. A quantum dot is a wavelength converting particle capable of emitting light of a specific wavelength by converting the wavelength of light incident on the quantum dot. Quantum dots can vary in wavelength depending on their size. For example, by controlling the diameter of the quantum dots, the quantum dots can emit light of a desired color.

Quantum dots have a higher extinction coefficient and higher quantum yield than conventional fluorescent dyes producing very strong fluorescence. In particular, quantum dots can emit light of shorter wavelengths and emit light of longer wavelengths.

Quantum dots may have a structure that includes core nanocrystals and shell nanocrystals surrounding core nanocrystals. In addition, the quantum dot may comprise an organic ligand bound to the shell nanocrystals and may comprise an organic coating layer surrounding the shell nanocrystals. The shell nanocrystals can be formed in two or more layers. The shell nanocrystals are placed on the surface of the core nanocrystals.

The quantum dots may include at least one of a group II compound semiconductor, a group III compound semiconductor, a group V compound semiconductor, and a group VI compound semiconductor. More specifically, the core nanocrystals constituting the quantum dot may include at least one of PbSe, InAs, PbS, CdSe, InGaP, CdTe, CdS, ZnSe, ZnTe, ZnS, HgTe and HgS. In an embodiment, the shell nanocrystals may include at least one of CuZnS, CdSe, CdTe, CdS, ZnSe, ZnTe, ZnS, HgTe and HgS.

For example, blue light can be generated when the core nanocrystals include CdSe and quantum dot diameters are in a range of 1 nm to 3 nm, and green light can be generated when the diameters of the quantum dots are in a range of 3 nm to 5 nm. Red light can be generated when the diameters of the quantum dots are in a range of 7 nm to 10 nm.

Quantum dots can be formed by a chemical wet process. The chemical wet method is a method of growing particles by adding a precursor material to an organic solvent. The wavelength of light emitted from the quantum dot particles can be controlled by the size of the quantum dot particles or by the molar ratio of the molecular cluster compound and the nanoparticle precursor in the synthesis process. The organic ligand may include at least one of pyridine, mercapto alcohol, thiol, phosphine and phosphine oxide, and the like. Organic ligands stabilize unstable quantum dot particles after synthesis. After synthesis, a dangling bond is formed on the outer surface, and due to the dangling bonds, the quantum dot particles may become unstable. However, one end of the organic ligand is in an unbonded state, and one end of the unbound organic ligand can be bonded with the dangling bond to stabilize the quantum dot particle.

The first color conversion unit 151 and the second color conversion unit 152 can convert light into infrared rays by configuring the diameters of the quantum dot particles. The quantum dot particles have respective diameter ranges that can emit infrared rays according to the compound semiconductors contained therein. For example, when the quantum dot particle includes PbSe, the light can be converted into infrared light when the diameter of the quantum dot particle is 3 nm or more. In the case where the quantum dot particle includes InAs, the light can be converted into infrared light when the diameter of the quantum dot particle is 30 nm or more. In an embodiment, when the quantum dot particle contains PbS, the light can be converted into infrared light when the diameter of the quantum dot particle is 18 nm or more. As described above, the quantum dot particles are manufactured by adjusting the diameters in consideration of the compound semiconductor contained therein.

The first color conversion layer 151a and the second color conversion layer 152a may include quantum rod particles instead of or in addition to the quantum dot particles.

The light diffusion unit 153 includes a light diffusion layer 153a and a light transmission layer 153b. The light diffusion unit 153 may be colorless and/or may not include wavelength conversion particles. That is, the light passing through the light diffusion unit 153 does not change its wavelength and can have the same wavelength as that of the light emitted from the backlight unit.

The light diffusion layer 153a may be formed of the same material as the first side-wall 171 and/or the second side-wall 172. That is, the light diffusion layer 153a may be formed through the same process as the first side-wall 171 and/or the second side-wall 172. Also, as shown in FIG. 5, the first side-wall 171 and the light diffusion layer 153a may be integrally formed. The light-transmitting layer 153b may be formed of a transparent photosensitive resin.

The first side-wall 171 is disposed between the first color conversion unit 151 and the light diffusion unit 153 or between the second color conversion unit 152 and the light diffusion unit 153. The first side-wall 171 may have a height of 5 micrometers or more. Accordingly, when the first color conversion unit 151 and the second color conversion unit 152 are manufactured through the inkjet process, the first side-wall 171 can serve as a dam.

A second side-wall 172 may overlap a data line and is disposed in a first color conversion unit 151 along the second direction D2 to divide two first color pixel R regions. Another second side-wall 172 may overlap another data line and is disposed in a second color conversion unit 152 along the second direction D2 to divide two second color G regions.

Second side-walls 172 may have substantially the same height as first side-walls 171.

According to an embodiment, as shown in FIG. 6, the second side-wall 172 may have a lower height (i.e., may be shorter) than the first side-wall 171. For example, the first side-wall 171 may have a height of 1 micrometer or less.

According to an embodiment, as shown in FIGS. 7 and 8, a second side-wall 172 may have at least one groove 172a (or gap 172a). The second side-wall 172 can be disconnected by the groove 172a. In an embodiment, the second side-wall 172 may have a stepped unit by the groove 172a. The ink disposed on the first substrate 101 through the inkjet process is supplied to the first color conversion unit 151 and the second color conversion unit 152 through the groove 172a formed in second side-walls 172.

The first color conversion unit 151 may be a straight line extending along the second direction D2 as shown in FIG. 7. In an embodiment, the first color conversion unit 151 may have a rectangular shape. For example, two pixel regions disposed adjacent to each other along the second direction D2 are divided by a second side-wall 172 extending along the first direction D1 and overlap a first color conversion unit 151. The first side-wall 171 and the second side-wall 172 may be formed of a photosensitive composition of a positive type.

The first side-wall 171 and the second side-wall 172 may be formed of a negative type photosensitive composition. The photosensitive composition used for forming the first side-wall 171 and the first side-wall 171 may include, for example, at least one of a binder resin, a polymerizable monomer, a polymerizable oligomer, a pigment, a dispersant, and a photo initiator.

The black matrix 190 may be disposed between the first substrate 101 and the first side-wall 171 and/or between the first substrate 101 and the second side-wall 172 as shown in FIG. 5. The black matrix 190 blocks the light emitted from the backlight unit. The black matrix 190 may be made of a photosensitive organic material.

Figure 9:
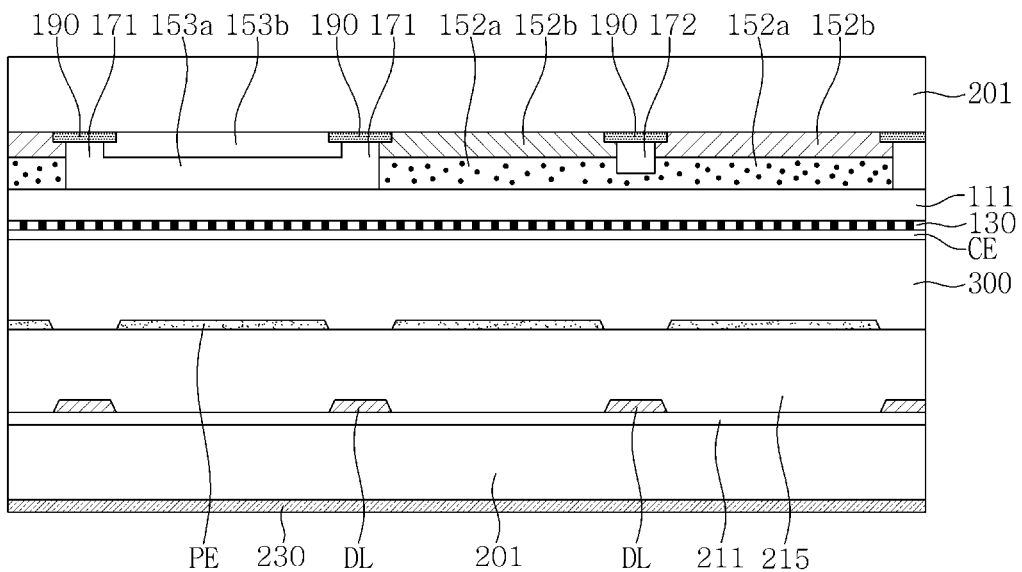
FIG. 9 is a cross-sectional view of a liquid crystal display panel according to an embodiment.

A cross-sectional view of a liquid crystal display panel according to an embodiment is shown in FIG. 9.

Referring to FIG. 9, the display device may include a first polarizer 130 and a common electrode CE. The black matrix 190 may be positioned corresponding to the data lines DL disposed on the second substrate 201. The planarization layer 111 may planarize and/or prevent elution of impurities from one or more of the first color conversion unit 151, the second color conversion unit 152, the light diffusion unit 153, the first side-wall 171, and the second side-wall 172.

The first polarizer 130 includes a plurality of line patterns arranged side by side in the planarization layer 111. Each line pattern has a linear shape extending in one direction and has a predetermined width spaced apart from each other at a predetermined interval. The line pattern can be made of metal. The first polarizer 130 including a plurality of line patterns made of metal is also referred to as a wire grid polarizer (WGP). The first polarizer 130 according to an embodiment is a wire grid polarizer (WGP). The line pattern may include at least one of, for example, aluminum (Al), gold (Au), silver (Ag), copper (Cu), chromium (Cr), and iron (Fe).

The first polarizer 130 can be made by an imprint method using a mold, photolithography, or the like. The first polarizer 130 may be made of a block copolymer. Since the first polarizer 130 is formed in a very thin and uniform line pattern, the first polarizer 130 may be disposed on the planarization layer 111 having excellent flatness. Thus, it has excellent polarization efficiency. The common electrode CE is located on the first polarizer 130. For example, the common electrode CE may be positioned on the front surface of the first substrate 101 including the first polarizer 130. The common electrode CE transmits, for example, a common voltage which is a DC voltage. In an embodiment, the common electrode may transmit an alternating voltage. The common electrode CE may be formed of a transparent conductive material such as ITO or IZO.

Referring to FIG. 1, FIG. 2, and FIG. 9, the second panel 200 may include a gate line, a data line (DL), a switching element, and a pixel electrode PE. The gate lines extend on the second substrate 201 in the first direction D1. The gate insulating film 211 may be located on the front surface of the second substrate 201 including the gate lines. The gate insulating film 211 may be made of silicon nitride (SiNx), silicon oxide (SiOx) or the like. In an embodiment, the gate insulating film 211 may have a multi-film structure including at least two insulating layers having different physical properties. The data lines DL are arranged on the second substrate 201 in a second direction D2. In an embodiment, the data lines DL may be located corresponding to the black matrix 190, may overlap second side-walls 172, and/or may overlap first side-walls 171, as shown in FIG. 9.

Gate lines and data lines DL are connected to corresponding switching elements. The protective film 215 may be disposed on the front surface of the second substrate 201 and may cover the data lines DL. The protective film 215 may be made of an inorganic insulating material such as silicon nitride (SiNx) or silicon oxide (SiOx). In an embodiment, the protective film 215 may be made of an inorganic insulating material. In an embodiment, inorganic insulating material having photosensitivity and a dielectric constant of about 4.0 may be used to form the protective film 215. The protective film 215 may have a bilayer structure including a lower inorganic film and an upper organic film so as to prevent damage to the exposed semiconductor layer while having excellent insulating properties of the organic film. The thickness of the protective film 215 may be greater than or equal to about 500 Å, and/or may be in a range from about 6,000 Å to about 8,000 Å.

The pixel electrodes PE are located on the protective film 215 in correspondence with the first color conversion unit 151, the second color conversion unit 152, and the light diffusion unit 153. The pixel electrode PE may be made of a transparent conductive material such as indium tin oxide (ITO) or indium zinc oxide (IZO). ITO may be a polycrystalline or single crystal material, and IZO may be a polycrystalline or single crystal material. A switching element is connected to each pixel electrode PE. The second polarizer 230 is located on the rear surface of the second substrate 201. The transmission axis of the second polarizer 230 and the transmission axis of the first polarizer 130 are orthogonal to each other. One of these transmission axes may be arranged in parallel with the gate line. According to an embodiment, a liquid crystal layer 300 is disposed between the first panel 100 and the second panel 200, which may be bonded by a sealing material.

The display device may further include a backlight unit including a light source and a plurality of optical sheets. In an embodiment, the light source can emit blue light. Accordingly, the light diffusion unit 153 can correspond to the third color pixel B. In an embodiment, the light diffusion unit 153 may be replaced with a third color conversion unit that converts light into a third color. In an embodiment, the third color conversion unit may include color conversion particles. In an embodiment, the third color conversion unit can overlap two pixel regions like the first color conversion unit 151*a* and the second color conversion unit 151*b*. In an embodiment, at least one of the first color conversion unit 151*a*, the second color conversion unit 151*b*, and the third color conversion unit may overlap two pixel regions.

A cross-sectional view of a display panel according to an embodiment is shown in FIG. 10. The display device includes an organic light emitting diode substrate 1100, a first organic light emitting diode 1310R, a second organic light emitting diode 1310G, a third organic light emitting diode 1310B, a touch panel 1700, a window 1900, and a shielding layer 1850.

The first to the third organic light emitting diodes 1310R, 1310G, and 1310B may be disposed on the organic light emitting diode substrate 1100. The organic light emitting diodes 1310R, 1310G, and 1310B may emit red light, green light, and blue light, respectively. Each of the organic light emitting diodes 1310R, 1310G, and 1310B may be disposed in a pixel region defined by two or more pixel defining layers, such as two or more of pixel defining layers 1330*a*, 1330*b*, and 1330*c*.

Each of the organic light emitting diodes 1310R, 1310G, and 1310B may include an organic light emitting layer and an electrode overlapping the organic light emitting layer. An auxiliary electrode layer may be formed for efficient transfer of electrons and holes. An encapsulation layer 1400 may be formed on the organic light emitting diodes 1310R, 1310G, and 1310B. The encapsulation layer 1400 protects the organic light emitting diodes 1310R, 1310G, and 1310B and the driving circuit.

The encapsulation layer 1400 may be formed by depositing an inorganic film and an organic film on the organic light emitting diodes 1310R, 1310G, and 1310B. The encapsulation layer 1400 may include sealing organic films and sealing inorganic films alternately stacked. For example, two encapsulating organic layers and two encapsulating inorganic layers may be alternately stacked to form the encapsulation layer 1400. The encapsulation layer 1400 may include a plurality of layers.

A color filter set 1510 may be formed on the encapsulation layer 1400. The color filter set 1510 may include a first color filter 1510R, a second color filter 1510G, and a third color filter 1510B having different colors. For example, the first color filter 1510R may be red, the second color filter 1510G may be green, and the third color filter 1510B may be blue.

In an embodiment, the color filters 1510R, 1510G, and 1510B are positioned corresponding to the optical paths of lights emitted from the organic light emitting units 1310R, 1310G, and 1310B, respectively. For example, the first color filter 1510R may be positioned corresponding to the optical path of the first organic light emitting unit element 1310R.

The first color filter 1510R may be disposed in parallel with the organic light emitting layer of the first organic light emitting unit element 1310R. The second color filter 1510G is located corresponding to the optical path of the second organic light emitting unit element 1310G. The second color filter 1510G and the second organic light emitting unit element 1310G may overlap each other. The third color filter 1510B may be positioned corresponding to the optical path of the third organic light emitting unit device 310B. The third color filter 1510B and the third organic light emitting unit device 1310B may overlap each other.

According to an embodiment, a touch panel 1700 may be disposed on the overcoat layer 1530 covering the color filter set 1510. The touch panel 1700 can detect contact by an external object. A first adhesive layer 1600 may be interposed between the touch panel 1700 and the overcoat layer 1530. The touch panel 1700 can be attached on the overcoat layer 1530 by the first adhesive layer 1600. A second adhesive layer 1800 is disposed on the touch panel 1700. The window 1900 can be attached to the touch panel 1700 by the second adhesive layer 1800. Similarly to the first adhesive layer 1600, the second adhesive layer 1800 may be made of silicone or acrylic pressure-sensitive adhesive such as PSA having a low modulus value, but is not limited thereto.

According to an embodiment, a light shielding layer 1850 may be formed on the bottom surface of the window 1900. The light-shielding layer 1850 may be formed of a light-shielding material capable of blocking transmission of light. A black material can be applied for forming the light-shielding layer 1850.

The light-shielding layer 1850 may expose regions the window 1900. The exposed regions are disposed corresponding to the optical paths associated with the organic light emitting diodes 1310R, 1310G, and 1310B. In an embodiment, the light shielding layer 1850 may be formed on the bottom surface of the window 1900 to reduce external reflectance.

FIG. 11A to FIG. 11I, show structures formed during a manufacturing process of a display device according to an embodiment. FIG. 12 is a view showing an inkjet process in a display device manufacturing process according to an embodiment.

Figure 11A:
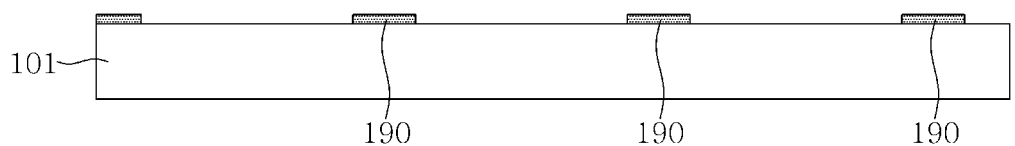
FIG. 11A, FIG. 11B, FIG. 11C, FIG. 11D, FIG. 11E, FIG. 11F, FIG. 11G, FIG. 11H, and FIG. 11I are cross-sectional views showing structures formed in a manufacturing process of a liquid crystal display panel according to an embodiment.
Figure 12:
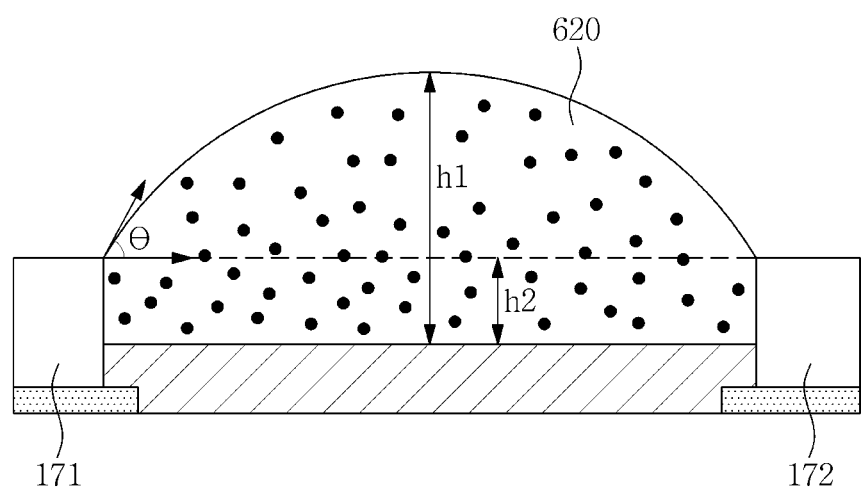
FIG. 12 is a cross-sectional view showing droplets arranged in a color conversion unit of a first panel in an inkjet process according to an embodiment.

Referring to FIG. 11A, a black matrix 190 is formed on a first substrate 101.

Figure 11B:
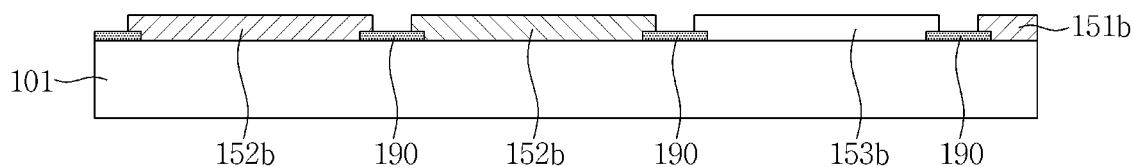

Referring to FIG. 11B, a first color filter layer 151*b*, a second color filter layer 152*b*, and a light transmitting layer 153*b* are formed.

The first color filter layer 151*b* and the second color filter layer 152*b* may each be formed of a photosensitive resin. The first color filter layer 151*b* may be formed of a photosensitive resin including a red pigment that transmits light having a wavelength in a range of 620 nm to 780 nm. The second color filter layer 152*b* may transmit a light having a wavelength in a range of 500 nm to 565 nm and may include a green pigment. In an embodiment, the light-transmitting layer 153*b* may be formed of a colorless transparent photosensitive resin containing no pigment.

Figure 11C:
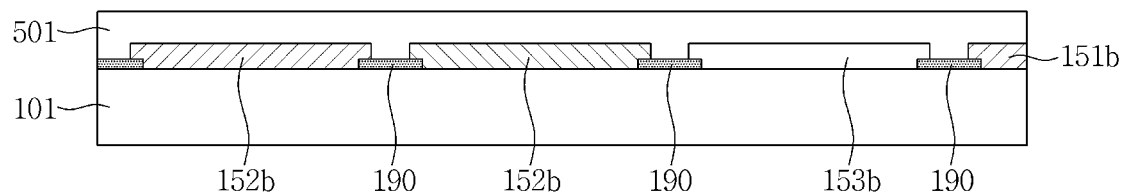

The first color filter layer 151*b*, the second color filter layer 152*b*, and the light transmission layer 153*b* may be formed through one or more exposure and development processes. Referring to FIG. 11C, a photosensitive resin 501 is formed on the first substrate 101, on which a black matrix 190, a first color filter layer 151*b*, a second color filter layer 152*b*, and a light transmitting layer 153*b* are formed.

Figure 11D:
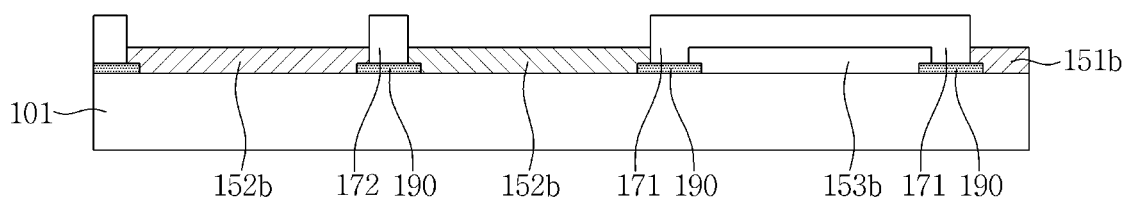

Referring to FIG. 11D, the photosensitive resin 501 applied on the first substrate 101 is patterned (and/or partially removed) to form first side-walls 171, second side-walls 172, and the light diffusion layer 153*a*. Thus, spaces defined by the first side-walls 171 and the second side-walls 172 are formed.

The first side-walls 171, the second side-walls 172, and the light diffusion layer 153*a* may be formed simultaneously using the same process and may be made of the same material. In an embodiment, one or more first side-walls 171 and the light diffusion layer 153a may be integrally formed.

Figure 11E:
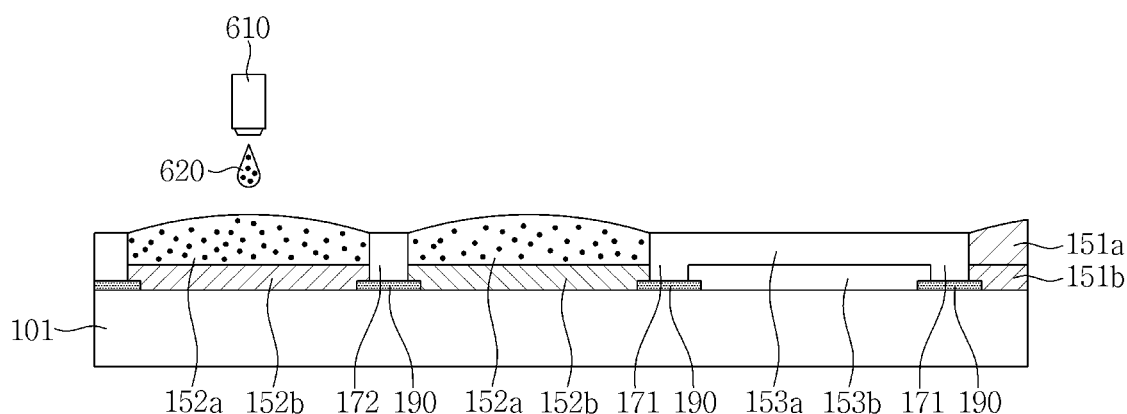
Figure 11F:
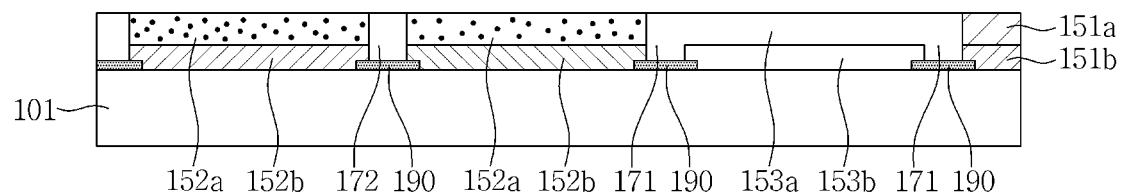

Referring to FIGS. 11E and 11F, a first color conversion layer 151a and a second color conversion layer 152a are formed through an inkjet process. Since the first color conversion unit 151 and the second color conversion unit 152 formed through the inkjet process are separated from each other by at least the light diffusion unit 153, the possibility of color mixture between the color conversion units may be minimized. Referring to FIG. 11E, the inkjet nozzle 610 ejects the droplet 620 into a space defined by a first side-wall 171 and a second side-wall 172.

The droplet 620 may be made of a resin containing color conversion particles. The color conversion particles emit fluorescence when irradiated with light or radiation, and emit light having a color inherent in the color conversion particles. In an embodiment, the color conversion particles emit light to the entire region irrespective of the direction of the irradiated light. For example, the color conversion particle may comprise a quantum dot or a quantum rod. The droplet 620 may include color conversion particles that emit light according to the color conversion layer to be formed. For example, the first color conversion layer 151a may include color conversion particles that emit light having a first color, and the second color conversion layer 152a may include conversion particles that emit light having a second color.

The inkjet nozzle 610 may provide color conversion particles that emits light of colors respectively identical to the colors of the color filter layers 151b and 152b located in spaces defined by first side-walls 171 and second side-walls 172. A droplet 620 containing particles is ejected into a space defined by a first side-wall 171 and a second side-wall 172. A first color conversion layer 151a that emits first-color light as a first color filter layer 151b is disposed on the first color filter layer 151b. A second color conversion layer 152a that emits second-color light as a second color filter layer 152b is disposed on the second color filter layer 152b.

Referring to FIG. 11F, the droplets 620 ejected into the spaces defined by the first side-walls 171 and the second side-walls 172 are thermally dried. Thus, the first color conversion layer 151a and the second color conversion layer 152a are formed. The droplets 620 protruding beyond the first side-walls 171 and second side-walls 172 are thermally dried and/or planarized so that the first color conversion layer 151a and the second color conversion layer 152a may have substantially the same height as the first side-walls 171 and/or the second side-walls 172.

Figure 11G:
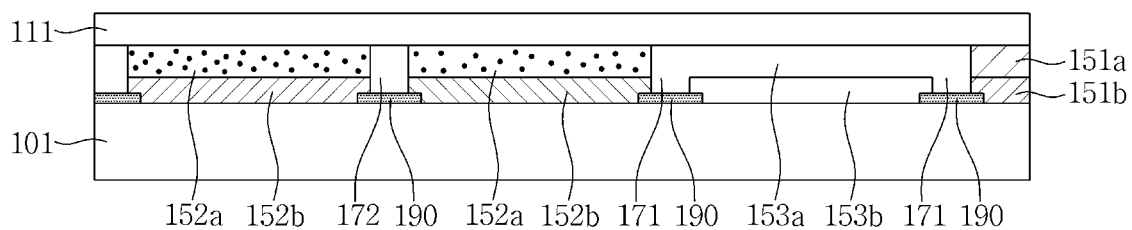

Referring to FIG. 11G, the planarization layer 111 is formed on the first substrate 101 on which a first color conversion unit 151, a second color conversion unit 152, a light diffusion unit 153, first side-walls 171, second side-walls 172, and a black matrix 190 are disposed.

Figure 11H:
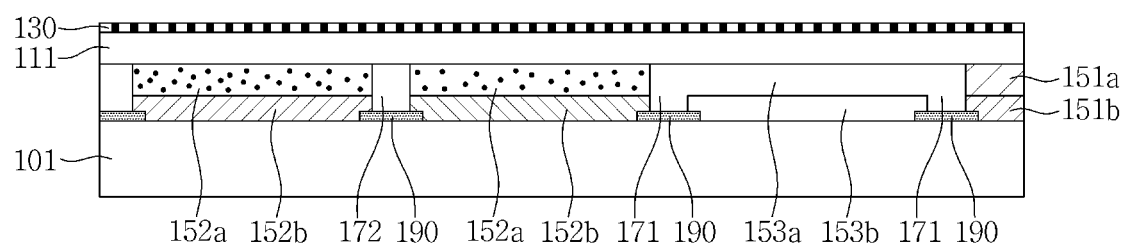

Referring to FIG. 11H, a first polarizing plate 130 is formed on the planarization layer 111. The first polarizer 130 includes a plurality of line patterns arranged side by side in the planarization layer 111. Each line pattern has a linear shape extending in one direction and has a predetermined width spaced apart from each other at a predetermined interval.

The line pattern can be made of metal. The polarizer including a plurality of line patterns made of metal is also referred to as a wire grid polarizer (WGP). The first polarizer 130 according to an embodiment is a wire grid polarizer (WGP).

The line pattern may include at least one of, for example, aluminum (Al), gold (Au), silver (Ag), copper (Cu), chromium (Cr), and iron (Fe). The first polarizer 130 can be made by an imprint method using a mold, a photolithography method, or the like. In an embodiment, the first polarizer 130 may be made of a block copolymer.

Figure 11I:
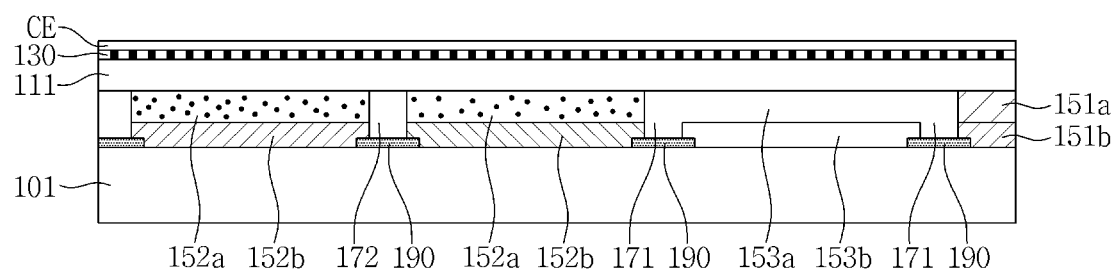

Referring to FIG. 11I, a common electrode is formed on the first polarizer 130. The common electrode CE may be positioned on the front surface of the first substrate 101 including the first polarizer 130. However, the embodiments are not limited thereto and may have a plurality of slits or irregularities. The common electrode CE may be formed of a transparent conductive material such as ITO or IZO.

Referring to FIG. 12, the droplet 620 ejected by the inkjet nozzle 610 is dried to remove the volatile solvent contained in the liquid droplet 620 and becomes a solid thin film. At the time, before, or after the droplet 620 ejected by the inkjet nozzle 610 is dried, the ejection amount of the droplet 620 may be adjusted for the resulted color conversion layer to have substantially the same height as the corresponding first side-wall 171. The volume ratio of the residual thin film to the volume of the droplet 620 applied to the unit area may be defined as the residual film ratio. The residual film ratio of the polymer film by the ink jet process is generally in a range of 10% to 50%.

According to embodiments, pixels having the same color are arranged adjacent to each other, so that the droplets 620 do not flow to pixel regions showing different colors. According to embodiments, ink-jet droplets can be accommodated in two or more pixel regions exhibiting the same color, thereby preventing mixing of different color filter materials.

Various modifications and variations can be made in the described embodiments without departing from the spirit or scope defined by the appended claims.

What is claimed is:

1. A display device comprising:
a first substrate;
a first color conversion unit located on the first substrate;
a second color conversion unit disposed on the first substrate and spaced from the first color conversion unit;
a light diffusion unit disposed between the first color conversion unit and the second color conversion unit; and
a first wall disposed between the first color conversion unit and the light diffusion unit,
wherein the first color conversion unit includes a first-color conversion layer, and
wherein the first-color conversion layer overlaps two pixel regions.

2. The display device of claim 1, further comprising: a second wall spaced from the first wall, extending parallel to the first wall, and positioned between two portions of the first-color conversion layer.

3. The display device of claim 2, further comprising: a black matrix disposed between at least one of the first wall and the second wall and the first substrate and defining boundaries of pixel region of the display device.

4. The display device of the claim 2, wherein a width of the first color conversion unit is in a range of 1.5 to 2.5 times a width of the light diffusion unit.

5. The display device of claim 2, wherein the first-color conversion layer comprises quantum dot particles.

6. The display device of claim 2, wherein the first wall is taller than the second wall.

7. The display device of claim 6, wherein the first wall has a height of 5 micrometers or more in a direction perpendicular to the first substrate.

8. The display device of claim 6, wherein the second wall has a height of 1 micrometer or less in a direction perpendicular to the first substrate.

9. The display device of claim 2, wherein a portion of the first-color conversion layer is positioned between two sections of the second wall and directly contacts each of the two sections of the second wall.

10. The display device of claim 1,
wherein the light diffusion unit is colorless and corresponds to the pixel region of the display device.

11. The display device of claim 1, wherein the first color conversion unit further comprises a first-color filter layer overlapping the first-color conversion layer, wherein the second color conversion unit comprises a second-color conversion layer and a second-color filter layer overlapping each other, and wherein the light diffusion unit comprises a light transmission layer and a light diffusion layer overlapping each other.

12. The display device of claim 1, further comprising:
a second substrate;
a gate line disposed on the second substrate and intersecting the first wall;
a data line disposed on the second substrate and intersecting the data line;
a switching element connected to the gate line and the data line;
a pixel electrode connected to the switching element;
a common electrode disposed on the first substrate; and
a liquid crystal layer disposed between the first substrate and the second substrate.

13. The display device of claim 1, further comprising:
a first organic light emitting diode;
a second organic light emitting diode; and
an encapsulation layer encapsulating each of the first organic light emitting diode and the second organic light emitting diode, positioned between the first organic light emitting diode and the first color conversion unit, and positioned between the second organic light emitting diode and the second color conversion unit.

14. The display device of claim 13, further comprising: a pixel defining layer, wherein the pixel defining layer is disposed between the first organic light emitting diode and the second organic light emitting diode, wherein a face of the pixel defining layer is coplanar with each of a face of the first organic light emitting diode and a face of the second organic light emitting diode.

15. The display device of claim 14, Wherein the first color conversion layer is disposed on the encapsulation layer.

16. The display device of claim 1, wherein the first color conversion unit further comprises a first-color filter layer overlapping the first-color conversion layer, wherein the light diffusion unit comprises a light transmission layer and a light diffusion layer overlapping each other, and wherein the first wall directly contacts each of the first-color conversion layer, the first-color filter layer, the light transmission layer, and the light diffusion layer.

17. The display device of claim 16, further comprising: a second wall extending parallel to the first wall, directly contacting each of the first-color conversion layer and the first-color filter layer, positioned between two portions of the first-color conversion layer, and positioned between two portions of the first-color filter layer.

18. The display device of claim 17, wherein the first-color conversion layer directly contacts two opposite sides of the second wall.

19. The display device of claim 16, further comprising: a data line overlapping the first-color conversion layer.

20. A display device comprising:
a first substrate;
a plurality of pixel electrodes overlapping the first substrate;
a first-color conversion unit disposed on the first substrate;
a second-color conversion unit disposed on the first substrate and spaced from the first-color conversion unit;
a third-color conversion unit disposed between the first-color conversion unit and the second-color conversion unit; and
a first wall disposed between the first-color conversion unit and the third-color conversion unit,
wherein the first-color conversion unit includes a set of first-color conversion particles,
wherein the set of first-color conversion particles overlaps two immediately neighboring pixel electrodes of the plurality of pixel electrodes, and
wherein each first-color conversion particle of the set of first-color conversion particles is configured to emit first-color light in response to received light.

* * * * *